United States Patent [19]
Yoshizawa

[11] Patent Number: 5,594,391
[45] Date of Patent: Jan. 14, 1997

[54] N-STAGE RING CONNECTED VOLTAGE CONTROLLED OSCILLATOR

[75] Inventor: Akihiko Yoshizawa, Yokohama, Japan

[73] Assignee: Kabushiki Kaisha Toshiba, Kawasaki, Japan

[21] Appl. No.: 229,791

[22] Filed: Apr. 19, 1994

[30] Foreign Application Priority Data

Apr. 21, 1993 [JP] Japan .................................... 5-094246

[51] Int. Cl.$^6$ ...................................................... H03B 5/00
[52] U.S. Cl. .......................... 331/57; 327/395; 327/264; 327/277; 327/393; 327/394; 331/1 A
[58] Field of Search ............................. 331/57, 25, 1 A, 331/108 D, 176; 327/392, 393, 394, 395, 396, 276, 278, 281, 285, 288, 277, 261, 264, 284; 330/264

[56] References Cited

U.S. PATENT DOCUMENTS

| | | | |
|---|---|---|---|
| 3,931,588 | 1/1976 | Gehweiler | 331/57 |
| 4,015,219 | 3/1977 | Kawagoe et al. | 331/111 |
| 4,146,849 | 3/1979 | Satou | 331/111 |
| 4,309,665 | 1/1982 | Yamashiro | 330/264 |
| 4,357,581 | 11/1982 | Higuchi | 331/66 |
| 5,081,428 | 1/1992 | Atriss et al. | 331/57 |
| 5,208,557 | 5/1993 | Kersh, III | 331/57 |

FOREIGN PATENT DOCUMENTS

| | | | |
|---|---|---|---|
| 0395118A1 | 10/1990 | European Pat. Off. | |
| 2548191 | 2/1977 | Germany | 331/57 |
| 0125954 | 9/1979 | Japan | 331/57 |
| 62-135011 | 6/1987 | Japan . | |
| 63-043416 | 2/1988 | Japan . | |
| 1-183147 | 7/1989 | Japan . | |
| 2-179121 | 7/1990 | Japan . | |
| 2249412 | 5/1992 | United Kingdom . | |
| WO92/16051 | 9/1992 | WIPO . | |

OTHER PUBLICATIONS

Technical Data Sheet for "YM3623 Digital Audio Interface Receiver (DIR)", Catalog No. LSI-1136230, 8 pages.
European Search Report.
S. K. Enam et al., "A 300-MHz CMOS Voltage-Controlled Ring Oscillator," IEEE Journal of Solid-State Circuits, vol. 25, No. 1 (Feb. 1990).

Primary Examiner—Robert Pascal
Assistant Examiner—Arnold Kinkead
Attorney, Agent, or Firm—Finnegan, Henderson, Farabow, Garrett & Dunner, L.L.P.

[57] ABSTRACT

A VCO includes an oscillator and a controller for controlling the operation of the oscillator. The oscillator is formed by connecting odd number of stages of delay circuits in a ring form. The controller creates a second control voltage based on an input first control voltage. The second control voltage is set in a symmetrical relation to the first control voltage with respect to an intermediate potential between the power supply and the ground set as a reference. Each of the delay circuits includes an inverter, first and second current control circuits, and first and second current value setting circuits. The inverter includes a first transistor of first conductivity type and a second transistor of second conductivity type to receive and output a signal. The first current control circuit is connected between the first transistor and the ground, for controlling a current flowing in the first transistor when the first transistor is set in the conductive state according to the first control voltage. The first current value setting circuit sets the minimum value of the current flowing in the first transistor. The second current control circuit is connected between the second transistor and the power supply, for controlling a current flowing in the second transistor when the second transistor is set in the conductive state according to the second control voltage. The second current value setting circuit sets the minimum value of the current flowing in the second transistor.

9 Claims, 7 Drawing Sheets

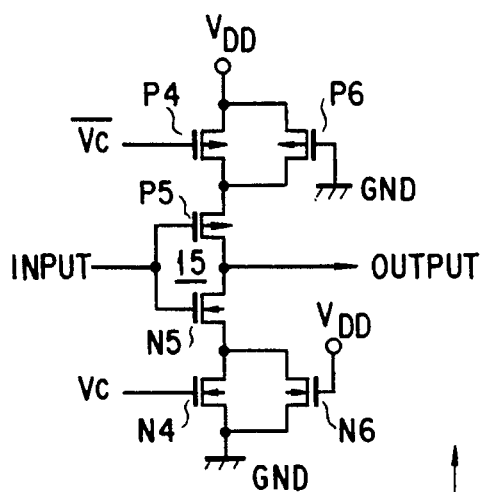
F I G. 4
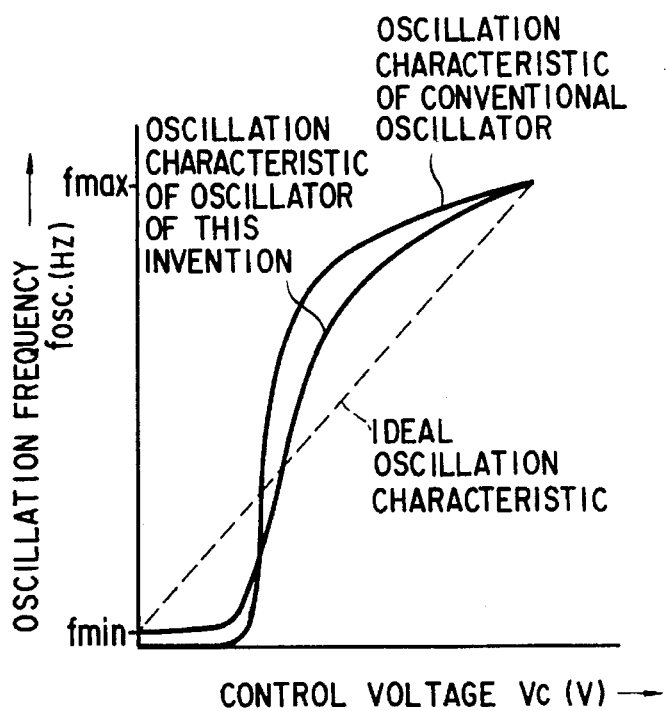
F I G. 5
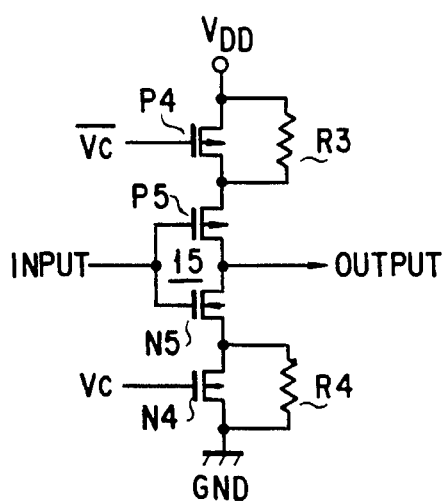
F I G. 6
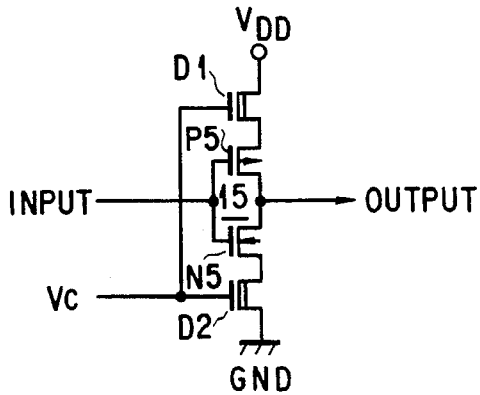
F I G. 7

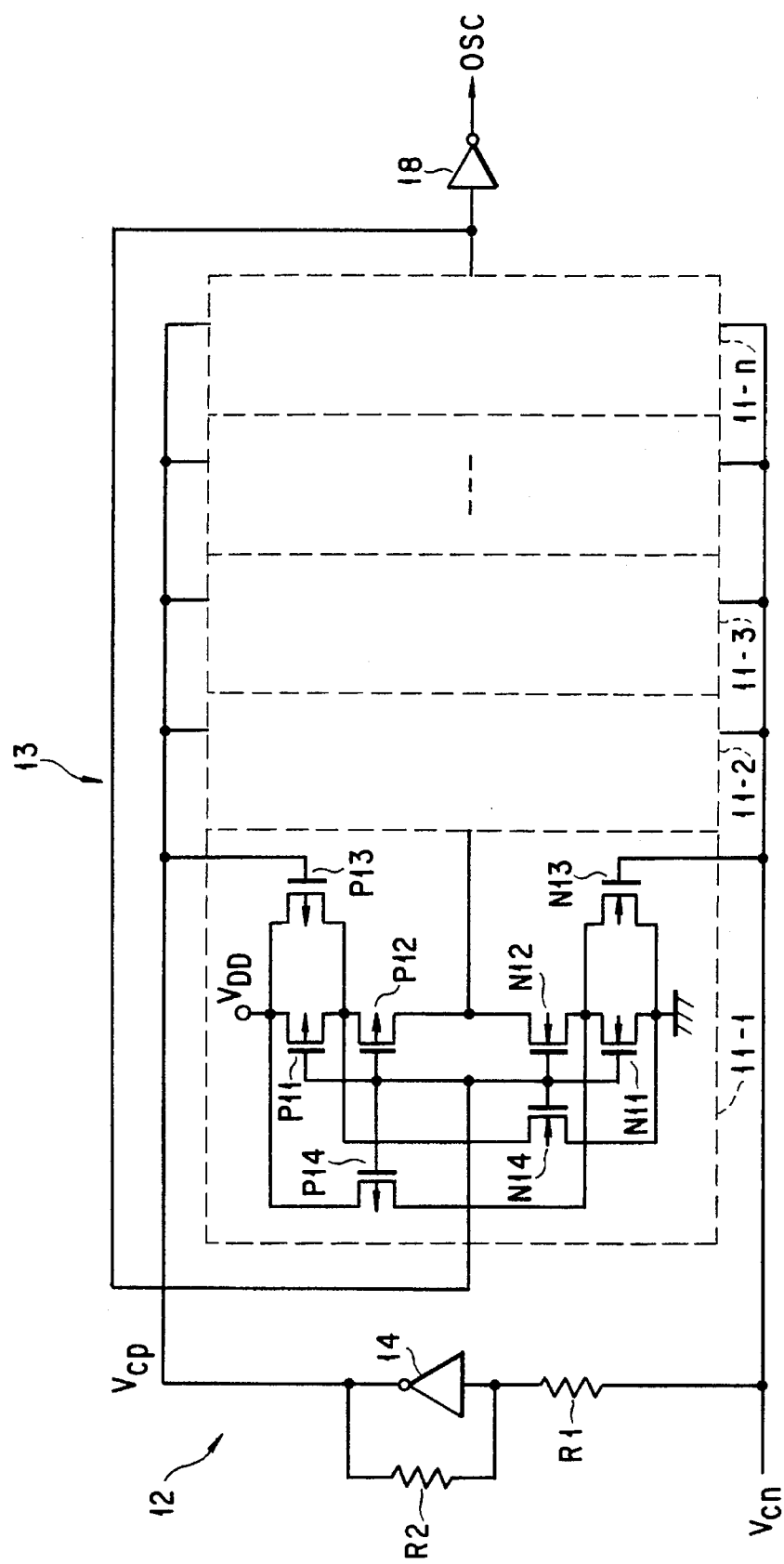
F I G. 10

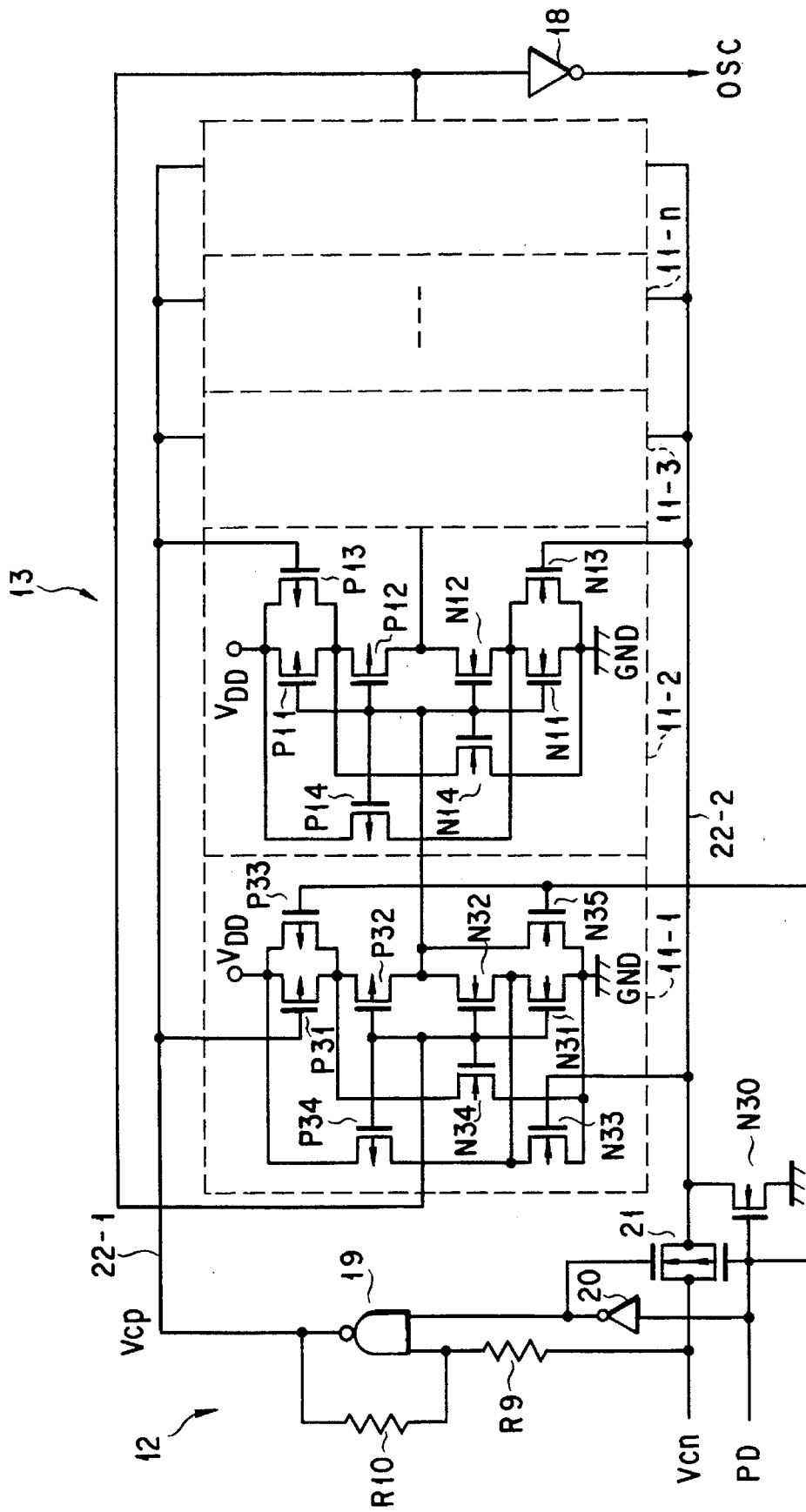
F I G. 12

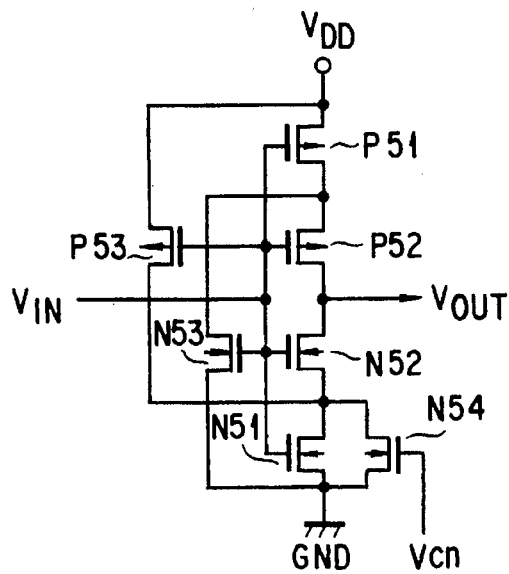
F I G. 14
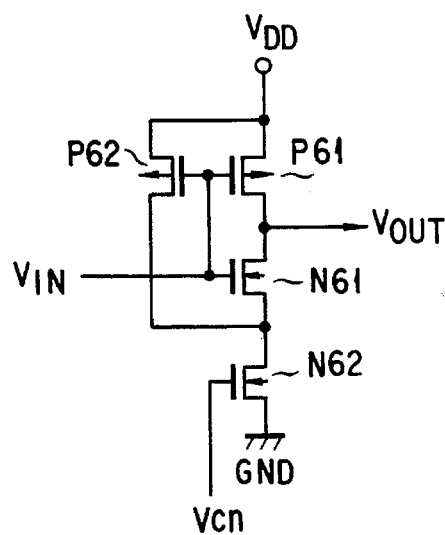
F I G. 15
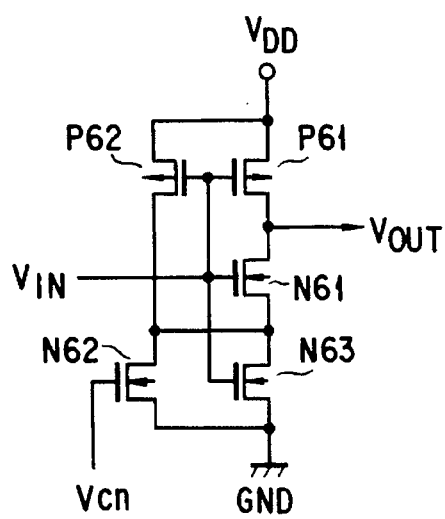
F I G. 16

N-STAGE RING CONNECTED VOLTAGE CONTROLLED OSCILLATOR

BACKGROUND OF THE INVENTION

1. Field of the Invention

This invention relates to a voltage controlled oscillator (VCO), and more particularly to a VCO used as a local oscillator of a PLL (Phase Locked Loop) circuit.

2. Description of the Related Art

FIG. 1 shows an example of the construction of the conventional VCO. The oscillator is built in "YM3623" (Digital Audio Interface Receiver) made by NIHON GAKKI SEIZOU KABUSHIKI KAISHA and is disclosed in the catalog No. LSI-1136230, p. 5.

The VCO shown in FIG. 1 has n-stage (n is an odd number) delay circuits 11-1 to 11-n connected in a ring form. As is represented by the delay circuit 11-1, each of the delay circuits 11-1 to 11-n includes P-channel MOS transistors P1, P2 and N-channel MOS transistors N1, N2. The MOS transistors P2 and N2 constitute a complementary inverter, the current path of the MOS transistor P1 is connected between the source of the MOS transistors P2 and a power supply $V_{DD}$, and the current path of the MOS transistor N1 is connected between the source of the MOS transistors N2 and a ground terminal GND. The gate of the MOS transistor P1 is connected to the ground terminal GND and the gate of the MOS transistor N1 is applied with a control voltage Vc. The output node of the first stage delay circuit 11-1 is connected to the input node of the second stage delay circuit 11-2, the output node of the second stage delay circuit 11-2 is connected to the input node of the third stage delay circuit 11-3, and in the same manner, the outputs of the delay circuits 11-3 to 11-(n-1) are respectively connected to the input nodes of the next stage delay circuits 11-4 to 11-n. The output node of the n-th stage delay circuit 11-n is connected to the input node of the first stage delay circuit 11-1. An oscillation output OSC is generated from the n-th stage delay circuit 11-n.

If the delay time of each of the delay circuits 11-1 to 11-n shown in FIG. 1 is Td, the oscillation frequency $f_{osc.}$ of the oscillator is expressed by the following equation.

$$f_{osc.} = 1/(Td \times n)$$

where n indicates the number of stages of the delay circuits.

The delay time Td depends on the time constant $\tau_{up}$ (=C×(rP1+rP2)) determined by the ON resistances rP1, rP2 of the MOS transistors P1, P2 and the parasitic capacitance C of the next stage gate capacitor or the like at the time of rise and depends on the time constant $\tau_{down}$ (=C×(rN1+rN2)) determined by the ON resistances rN1, rN2 of the MOS transistors N1, N2 and the parasitic capacitance C at the time of fall. Therefore, the following relation can be obtained.

$$Td \propto (\tau_{up} + \tau_{down})/2$$

If the control voltage Vc is changed, the ON resistance rN1 of the MOS transistor N1 is changed and the delay time Td is changed, thereby making it possible to change the oscillation frequency $f_{osc.}$.

FIG. 2 shows the oscillation characteristic of the oscillator shown in FIG. 1. As shown in FIG. 2, the oscillation frequency $f_{osc.}$ can be changed by the width of ΔW by changing the control voltage Vc.

However, in the conventional oscillator as shown in FIG. 1, since the oscillation frequency $f_{osc.}$ is controlled only by use of the MOS transistor N1, the oscillation is made unstable by the unbalance between the time constants $\tau_{up}$ and $\tau_{down}$ particularly when the control voltage Vc becomes low and the MOS transistor N1 is turned OFF and the oscillation is interrupted when the control voltage is further lowered. Further, the stability of the oscillation frequency $f_{osc.}$ depends on the inclination of the control voltage Vc-oscillation frequency $f_{osc.}$ characteristic curve shown in FIG. 2 and the stable oscillation can be attained when the inclination is small. Therefore, in order to attain the stable oscillation in the conventional VCO, the variable range of the oscillation frequency cannot be increased to a large extend. Further, in a case where the VCO is used in an application system which is made unstable or erroneously operated when the oscillation is interrupted, it is necessary to make such a circuit design that the control voltage Vc will not become lower than a preset voltage.

For this reason, when the conventional VCO is used as a core cell for automatic design such as a semi-custom LSI, for example, the range of the application system may be limited by the limitation of the variable frequency and, thus, a limitation on the application thereof, caused by the fact that the oscillation is interrupted when the control voltage becomes excessively low, may be imposed. Therefore, it cannot be used as a core cell when high flexibility is required.

As described above, the conventional VCO cannot be applied to various types of application systems since the variable range of the oscillation frequency is narrow and the oscillation frequency which is stable in a range from the low frequency to the high frequency cannot be obtained. Further, the oscillation is interrupted when the control voltage is set to the ground potential and it is difficult to easily apply the VCO to the application system.

SUMMARY OF THE INVENTION

An object of this invention is to provide a voltage controlled oscillator in which the variable range of the oscillation frequency can be increased and the stable oscillation frequency can be attained in a range from the low frequency to the high frequency.

Another object of this invention is to provide a voltage controlled oscillator which can be applied to various types of application systems.

Still another object of this invention is to provide a voltage controlled oscillator whose oscillation is not interrupted when the control voltage is set to the ground potential and which can be easily applied to application systems.

Another object of this invention is to provide a voltage controlled oscillator which can prevent the influence by the charge sharing due to the parasitic capacitor.

Still another object of this invention is to provide a voltage controlled oscillator which can be less influenced by a variation in the control voltage and a variation in the threshold voltage of each MOS transistor caused in the manufacturing process and which can prevent degradation of the duty of the oscillation waveform and occurrence of abnormal oscillation caused by the degradation of the duty.

The above object can be attained by a voltage controlled oscillator comprising a complementary inverter having a first transistor of first conductivity type and a second transistor of second conductivity type; a first current control circuit connected between the first transistor and a first potential supplying source, for controlling a current flowing in the first transistor when the first transistor is set in the conductive state according to a first control voltage; a first current value setting circuit for setting the minimum value of a current flowing in the first transistor; a second current control circuit connected between the second transistor and a second potential supplying source, for controlling a current flowing in the second transistor when the second transistor is set in the conductive state according to a second control voltage which is set in a symmetrical relation to the first control voltage with respect to an intermediate potential between the potential of the first potential supplying source and the potential of the second potential supplying source set as a reference; and a second current value setting circuit for setting the minimum value of a current flowing in the second transistor; wherein an odd number of stages of delay circuits for delaying a signal input to an input terminal of the complementary inverter and then outputting the signal from an output terminal thereof are connected in a ring form.

With the above construction, the first and second current control circuits are provided and controlled according to the first and second control voltages which are set in the symmetrical relation with respect to the intermediate potential between the potentials of the second and first potential supplying sources set as a reference so that the variable range of the oscillation frequency can be enlarged and the oscillation frequency which is stable in a range from the low frequency to the high frequency can be attained, thereby making it possible to apply the voltage controlled oscillator to be applied to various types of application systems. Further, the first and second current value setting circuits are provided to permit current flow even when the control voltage becomes 0 V so that the oscillation state can be maintained even when the control voltage is set to the ground potential, thereby making it possible to apply the voltage controlled oscillator to be applied to various types of application systems.

Further, the above object can be attained by a voltage controlled oscillator comprising a complementary inverter having a first transistor of first conductivity type and a second transistor of second conductivity type; a third transistor of depletion type which is connected between the first transistor and a first potential supplying source and whose conduction state is controlled according to a control voltage; and a fourth transistor of depletion type which is connected between the second transistor and a second potential supplying source and whose conduction state is controlled according to the control voltage; wherein an odd number of stages of delay circuits for delaying a signal input to the complementary inverter and then outputting the signal from an output terminal thereof are connected in a ring form.

Since the two depletion type transistors are provided, the variable range of the oscillation frequency can be enlarged in comparison with the conventional voltage controlled oscillator in which only one of the transistors is controlled by a control voltage, and since the depletion type transistor permits current flow even when the gate potential thereof is 0 V, the oscillation state can be maintained even if the control voltage is set to the ground potential. Therefore, the voltage controlled oscillator having a smaller number of elements can be easily applied to various type of application systems.

Further, the object of this invention can be attained by a voltage controlled oscillator comprising an inverter; a current control circuit connected to an output terminal of the inverter, for controlling an output current of the inverter according to a control voltage; and a current value setting circuit for setting the minimum value of the output current of the inverter; wherein an odd number of stages of delay circuits for outputting a delay signal of a signal input to the inverter via the current control circuit are connected in a ring form.

Since the current control circuit for controlling the output current of the inverter according to the control voltage and the current value setting circuit for setting the minimum value of the output current of the inverter are provided, it becomes possible to vary the oscillation frequency according to the control voltage, and since a current set by the current value setting circuit flows even when the control voltage is 0 V, the oscillation state can be maintained.

The object of this invention can be attained by a voltage controlled oscillator comprising a first transistor of first conductivity type whose current path is connected at one end to a potential supplying source and whose conduction state is controlled by an input signal; a second transistor of the first conductivity type whose current path is connected at one end to the other end of the current path of the first transistor and whose conduction state is controlled by the input signal; a third transistor of the second conductivity type whose current path is connected at one end to the other end of the current path of the second transistor and whose conduction state is controlled by the input signal; a fourth transistor of the second conductivity type which is connected between the other end of the current path of the third transistor and a second current supplying source and whose conduction state is controlled by the input signal; a fifth transistor of the first conductivity type which is connected between the first potential supplying source and a connection node of the first and second transistors and whose conduction state is controlled by a first control voltage; a sixth transistor of the second conductivity type which is connected between a connection node of the third and fourth transistors and the second potential supplying source and whose conduction state is controlled by a second control voltage which is symmetrical to the first control voltage with respect to an intermediate potential between the potentials of the second and first potential supplying sources; a seventh transistor of the first conductivity type which is connected between the first potential supplying source and the connection node of the third and fourth transistors and whose conduction state is controlled by the input signal; and an eighth transistor of the second conductivity type which is connected between the connection node of the first and second transistors and the second potential supplying source and whose conduction state is controlled by the input signal; wherein an odd number of stages of delay circuits for outputting a delay signal of the input signal from a connection node of the second and third transistors are connected in a ring form.

With the above construction, the minimum oscillation frequency is defined by the first and fourth transistors and an oscillation frequency (ranging from the minimum oscillation frequency to the maximum oscillation frequency) corresponding to the levels of the first and second control voltages can be set by means of the fifth and sixth transistors. The eighth transistor functions to discharge the connection node of the first, second and fifth transistors to the "L" level when the level of the input signal is set close to the threshold voltage of the second transistor and the second transistor is turned OFF. The seventh transistor functions to charge the connection node of the third, fourth and sixth transistors to the "H" level when the level of the input signal is set close to the threshold voltage of the third transistor and the third transistor is turned OFF. When the second or third transistor is set in the ON state, the potentials between the sources and drains of the above transistors can be set substantially equal to each other. As a result, the parasitic capacitor between the connection node of the first, second and fifth transistors and the first potential supplying source and that between the connection node of the third, fourth and sixth transistors and the second potential supplying source are not charged so that the charge sharing can be prevented.

Further, the object of this invention can be attained by a voltage controlled oscillator comprising a first transistor of first conductivity type which is connected between a first potential supplying source and an output terminal and whose conduction state is controlled by an input signal; a second transistor of second conductivity type whose current path is connected at one end to the output terminal and whose conduction state is controlled by the input signal; a third transistor of the second conductivity type which is connected between the other end of the current path of the second transistor and a second potential supplying source and whose conduction state is controlled by a control voltage; and a fourth transistor of the first conductivity type which is connected between the first potential supplying source and a connection node of the second and third transistors and whose conduction state is controlled by the input signal; wherein an odd number of stages of delay circuits for outputting a signal obtained by delaying the input signal from the output terminal are connected in a ring form.

With the above construction, the potential of the connection node of the second and third transistors can be made stable by means of the fourth transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a circuit diagram showing an example of the construction of each delay circuit in the circuit shown in FIG. 3;

FIG. 5 is a characteristic diagram showing the oscillation characteristics of the oscillator according to this invention and the conventional oscillator;

FIG. 6 is a circuit diagram showing another example of the construction of each delay circuit in the circuit shown in FIG. 3, for illustrating a voltage controlled oscillator according to a second embodiment of this invention;

FIG. 7 is a circuit diagram showing another example of the construction of a delay circuit constituting the oscillator, for illustrating a voltage controlled oscillator according to a third embodiment of this invention;

FIG. 10 is a circuit diagram showing another example of the construction obtained by improving the delay circuit shown in FIG. 4, for illustrating a voltage controlled oscillator according to a sixth embodiment of this invention;

FIG. 12 is a circuit diagram showing a voltage controlled oscillator according to a seventh embodiment of this invention;

FIG. 14 is a circuit diagram showing an example of the construction of the delay circuit, for illustrating a voltage controlled oscillator according to a ninth embodiment of this invention;

FIG. 15 is a circuit diagram showing an example of the construction of the delay circuit, for illustrating a voltage controlled oscillator according to a tenth embodiment of this invention; and FIG. 16 is a circuit diagram showing an example of the construction of the delay circuit, for illustrating a voltage controlled oscillator according to an eleventh embodiment of this invention.

DETAILED DESCRIPTION OF THE PREFERRED EMBODIMENTS

Figure 3:
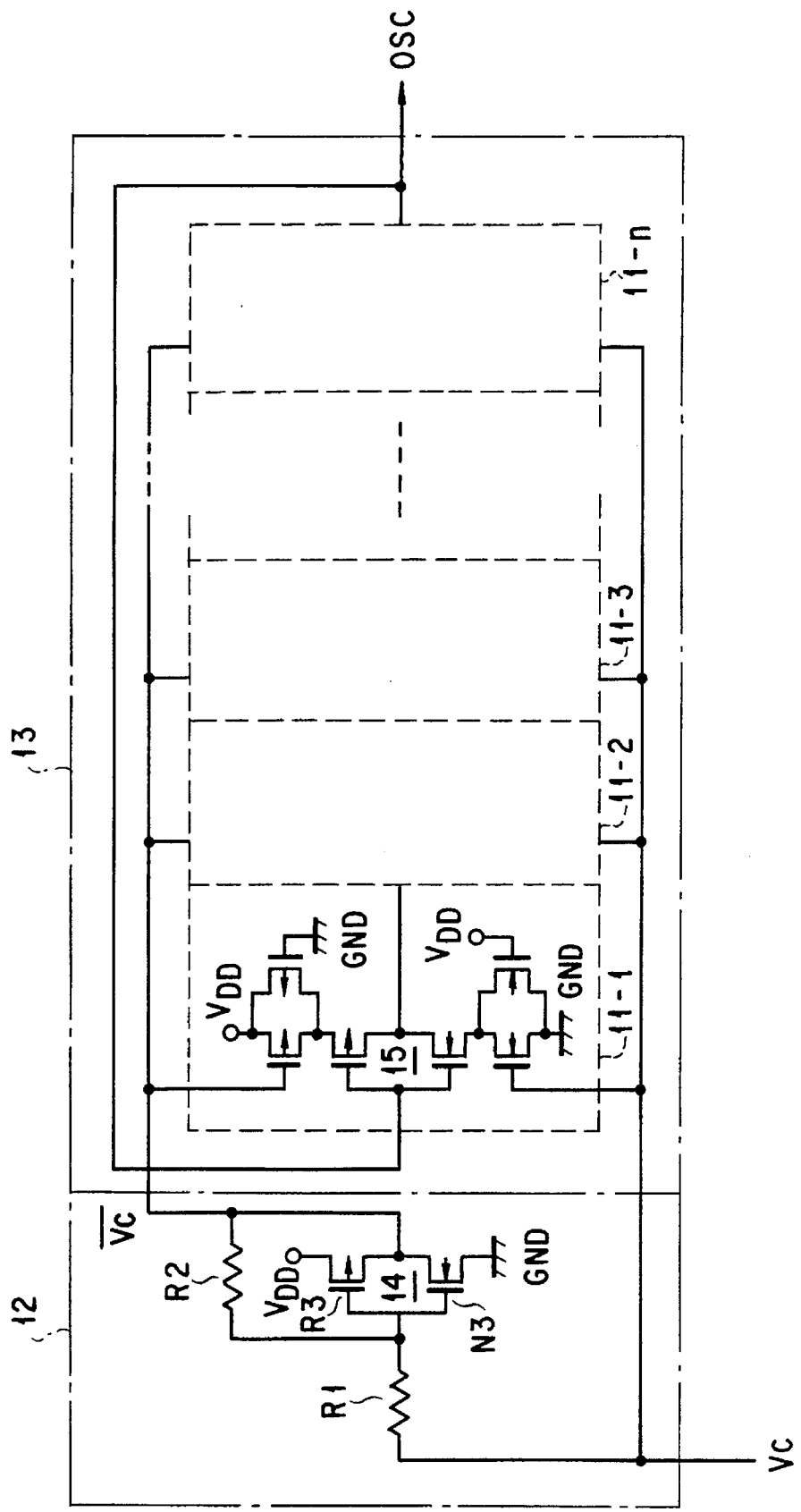
FIG. 3 is a circuit diagram showing the construction of a voltage controlled oscillator according to a first embodiment of this invention.

FIG. 3 is a circuit diagram showing the construction of a voltage controlled oscillator (VCO) according to a first embodiment of this invention, and FIG. 4 is a circuit diagram showing an extracted one of the delay circuits in the VCO shown in FIG. 3.

As shown in FIG. 3, the VCO includes a control section 12 and an oscillator section 13, and the control section 12 includes a complementary inverter 14 and resistors R1 and R2. The inverter 14 is constructed by a P-channel MOS transistor P3 and an N-channel MOS transistor N3. One end of the resistor R1 is applied with a control voltage Vc and the other end thereof is connected to the input terminal of the inverter 14. The resistor R2 is connected between the input terminal and output terminal of the inverter 14. The oscillator section 13 has a construction made by connecting n-stage (n is an odd number) delay circuits 11-1 to 11-n in a ring form. The output terminal of the inverter 14 is connected to the gate of a P-channel MOS transistor of each of the delay circuits 11-1 to 11-n.

If the the resistances of the resistors R1 and R2 are respectively expressed by r1 and r2, the gain G of the control section 13 can be expressed by $G=-r2/r1$ and it can be constructed as an inverting amplifier having a gain of 1 by setting r1 and r2 equal to each other. Since the central point of the operation is used as the circuit threshold value of the inverter 14, the central point of the operation is set to $V_{DD}/2$ if the sizes of the elements are determined such that the mutual conductances gm of the MOS transistors P3 and N3 can be set equal to each other. As a result, an output voltage $\overline{Vc}$ which is substantially symmetrical to the control voltage Vc with respect to $V_{DD}/2$ set as the center (reference). The inverter 14 can be replaced by a general operation amplifier, but the inverter has an advantage that the operation range of the input/output voltage is wide, the circuit design can be simplified because it is less influenced by a variation in the manufacturing process, and the circuit scale can be made small.

As shown in FIG. 4, each of the delay circuits 11-1 to 11-n of the oscillator section 13 includes P-channel MOS transistors P4, P5 and P6, and N-channel MOS transistors N4, N5 and N6. The MOS transistors P5 and N5 construct a complementary inverter 15. The current paths of the MOS transistors P4 and P6 for controlling the oscillation frequency are connected in parallel between the source of the MOS transistor P5 and the power supply $V_{DD}$. Further, the current paths of the MOS transistors N4 and N6 for controlling the oscillation frequency are connected in parallel between the source of the MOS transistor N5 and the ground terminal GND. The gate of the MOS transistor P4 is connected to the output terminal of the inverter 14 of the control section 12 so as to be applied with a control voltage $\overline{Vc}$ and the gate of the MOS transistor P6 is connected to the ground terminal GND. The gate of the MOS transistor N4 is applied with the control voltage Vc and the gate of the MOS transistor N6 is connected to the power supply $V_{DD}$.

With the above construction, the MOS transistors P6 and N6 function to determine the minimum value of a current flowing in the MOS transistors P5, N5 when the MOS transistors P4 and N4 are set in the OFF state, and the oscillation state can be maintained by the two MOS transistors even if the control voltage Vc is lowered to the ground potential ($\overline{Vc}$ is set to the power supply potential). Since the minimum value of the oscillation frequency $f_{osc.}$ is determined by the above two MOS transistors, the minimum value of the oscillation frequency $f_{osc.}$ can be easily designed by changing the sizes (channel lengths L and channel widths W) of the two MOS transistors P6 and N6. Further, the MOS transistors P4 and N4 function to determine the maximum value of a current caused when the control voltage Vc is set to the power supply potential $V_{DD}$ ($\overline{Vc}$ is set to the ground potential GND), and since the maximum value of the oscillation frequency $f_{osc.}$ is determined by the two MOS transistors, the maximum value of the oscillation frequency $f_{osc.}$ can be easily designed by changing the sizes of the two MOS transistors.

Figure 1:
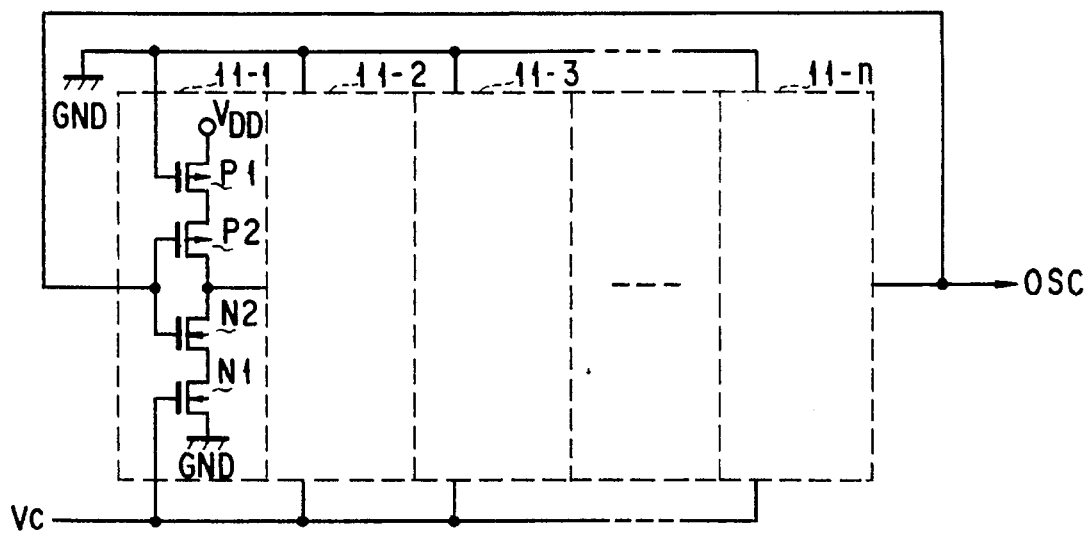
FIG. 1 is a circuit diagram showing an example of the construction of the conventional voltage controlled oscillator.
Figure 2:
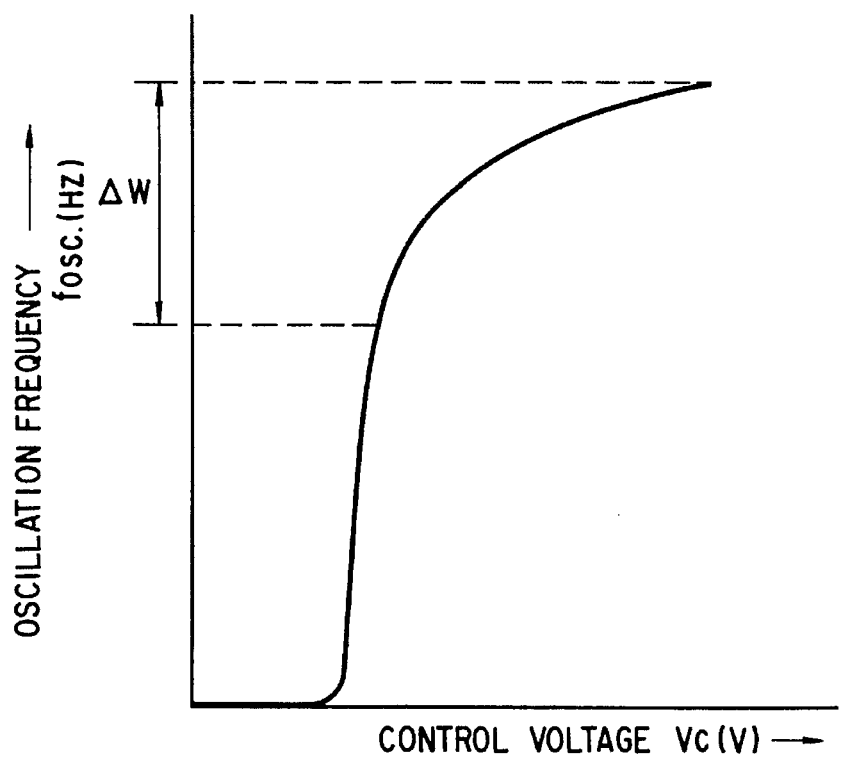
FIG. 2 is a characteristic diagram showing the oscillation frequency of the oscillator shown in FIG. 1.

FIG. 5 shows the oscillation characteristics of the VCO of this invention as shown in FIGS. 3 and 4 and the oscillation characteristic of the conventional VCO shown in FIG. 1 for easy comparison. In FIG. 5, broken lines indicate an ideal oscillation characteristic. As shown in FIG. 5, the oscillation characteristic of the oscillator of this invention is closer to the ideal oscillation characteristic than the oscillation characteristic of the conventional oscillator, the variable range of the oscillation frequency can be enlarged, and the oscillation state can be maintained even if the control voltage Vc becomes 0 V.

The following effects (a) to (c) can be attained in this invention.

(a) As shown in FIG. 5, the oscillation characteristic of the oscillator of this invention can be made closer to the ideal oscillation characteristic than the oscillation characteristic of the conventional oscillator and the variable range of the oscillation frequency can be enlarged.

(b) A problem that the oscillation operation is interrupted when the control voltage Vc is set to the ground potential will not occur.

(c) In the embodiment shown in FIG. 3, an inverting amplifier having a gain of 1 is constructed by an inverter and two resistor elements in order to obtain the control voltage $\overline{Vc}$ which is substantially symmetrical to the control voltage Vc with respect to the center set at $V_{DD}/2$. The operation range can be enlarged by means of the inverting amplifier and it is possible to suppress the influence by a variation in the manufacturing process. The inverting amplifier is small in the circuit scale and the pattern occupied area thereof is not substantially increased.

FIG. 6 shows another example of the construction of each delay circuit shown in FIG. 4, for illustrating a VCO according to a second embodiment of this invention. In this circuit, a resistor R3 is used instead of the MOS transistor P6 in the circuit shown in FIG. 4 and a resistor R4 is used instead of the MOS transistor N6. Since the MOS transistors P6 and N6 of FIG. 4 are both set in the normally ON state and function as load elements, basically the same operation can be effected even if the resistors R3 and R4 are used instead of the above MOS transistors as shown in FIG. 6, and the same effect can be attained.

Figure 8:
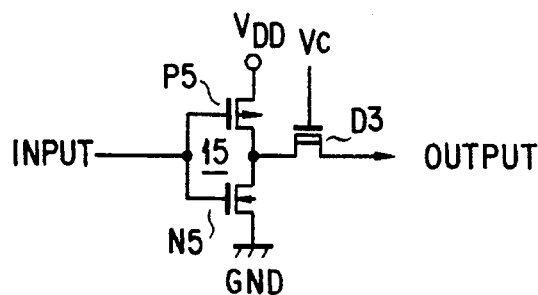
FIG. 8 is a circuit diagram showing still another example of the construction of a delay circuit constituting the oscillator, for illustrating a voltage controlled oscillator according to a fourth embodiment of this invention.

FIGS. 7 and 8 show different examples of the construction of a delay circuit, for illustrating a VCO according to third and fourth embodiments of this invention.

In the circuit of FIG. 7, a depletion type MOS transistor D1 is used instead of the MOS transistors P4 and P6 used in the circuit of FIG. 4 and a depletion type MOS transistor D2 is used instead of the MOS transistors N4 and N6. The control voltage Vc is applied to the gates of the MOS transistors D1 and D2. Like the former embodiment, an odd number of stages of delay circuits are connected in a ring form to construct a VCO.

With the above construction, since the depletion type MOS transistors D1 and D2 permit current flow therein even if the gate potential thereof is 0 V, the oscillation state can be maintained even when the control voltage Vc is set to the ground potential as in the former embodiments. Further, since the ON resistance thereof varies according to the control voltage Vc, the same operation and effect as those of the circuit shown in FIG. 6 can be attained by use of a small number of elements.

In the circuit of FIG. 8, a depletion type MOS transistor D3 is connected to the output terminal of the inverter 15. The control voltage Vc is applied to the gate of the MOS transistor D3. With this construction, the delay time of rise and fall of an output signal of the inverter 15 is controlled according to the ON resistance of the MOS transistor D3. Since the depletion type MOS transistor D3 permits current flow therein even if the gate potential thereof is 0 V, the oscillation state can be maintained even when the control voltage Vc is set to the ground potential as in the former embodiments.

Figure 9:
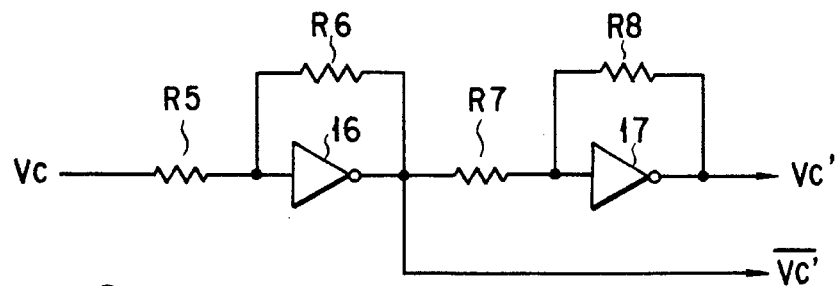
FIG. 9 is a circuit diagram showing another example of the construction of a control section in the circuit shown in FIG. 3, for illustrating a voltage controlled oscillator according to a fifth embodiment of this invention.

FIG. 9 shows another example of the construction of the control section 12 in the circuit shown in FIG. 3, for illustrating a VCO according to a fifth embodiment of this invention. The circuit of FIG. 9 includes two inverters 16 and 17 and four resistors R5 to R8. The circuit is obtained by connecting two stages of control sections each of which is the same as the control section 12 in the circuit of FIG. 3. That is, the control voltage Vc is applied to one end of the resistor R5 which is connected at the other end to the input terminal of the inverter 16. The resistor R6 is connected between the input terminal and output terminal of the inverter 16. The output terminal of the inverter 16 is connected to one end of the resistor R7 which is connected at the other end to the input terminal of the inverter 17. The resistor R8 is connected between the input terminal and output terminal of the inverter 17. A control voltage Vc' which is in phase with the control voltage Vc is derived from the output terminal of the inverter 17 and a control voltage $\overline{Vc'}$ which is substantially symmetrical to the control voltage Vc with respect to $V_{DD}/2$ ($V_{DD}$ is a power supply voltage of the inverter 16) set as a reference is derived from the output terminal of the inverter 16.

The control section 12 with the construction shown in FIG. 9 effects substantially the same operation as the control section 12 shown in FIG. 3 and the same effect can be attained by applying the control section to the oscillation section constructed by connecting an odd number of stages of delay circuits of the construction shown in FIGS. 4 and 6 in a ring form.

Figure 11:
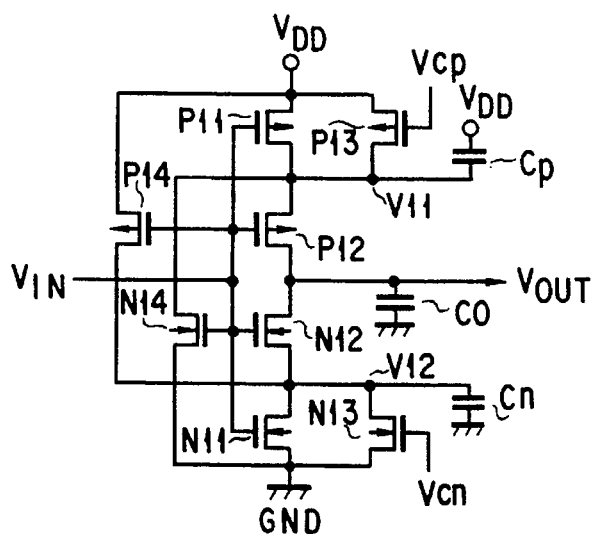
FIG. 11 is a circuit diagram specifically showing the construction of a delay circuit in the circuit shown in FIG. 10.

FIGS. 10 and 11 respectively show the constructions of circuits obtained by improving the VCOs shown in FIGS. 3 and 4, for illustrating a VCO according to a sixth embodiment of this invention. That is, when the delay circuit of the construction shown in FIG. 4 is formed in an IC form, first and second parasitic capacitors are respectively formed between a connection node of the drains of the P-channel MOS transistors P4 and P6 and the power supply $V_{DD}$ and between a connection node of the drains of the N-channel MOS transistors N4 and N6 and the ground terminal GND. Further, a third parasitic capacitor is formed between the output terminal of the inverter 15 and the ground terminal GND. The charge sharing occurs between the first and second parasitic capacitors and the third parasitic capacitor and the delay time becomes shorter than the designed value, and therefore, it becomes difficult to set the minimum oscillation frequency of the oscillator to a low frequency. Further, if the threshold voltage Vth of the MOS transistor varies according to the manufacturing process fluctuation and when the control voltage Vc is set closer to the threshold voltage Vth, the transistor P4 first starts to permit current flow while the transistor N4 is kept in the OFF state, and thus the balance between the P-channel MOS transistor and the N-channel MOS transistor cannot be maintained and the duty of the oscillation waveform is degraded. Therefore, in the sixth embodiment, the presence of the parasitic capacitors and a variation in the threshold voltage of the MOS transistor caused by the manufacturing process fluctuation are taken into consideration.

As shown in FIG. 10, the VCO includes a control section 12 and an oscillator section 13, and the control section 12 includes a complementary inverter 14 and resistors R1 and R2. One end of the resistor R1 is applied with a control voltage Vcn and the other end thereof is connected to the input terminal of the inverter 14. The resistor R2 is connected between the input terminal and output terminal of the inverter 14. A control voltage Vcp is output from the output terminal of the inverter 14 and the control voltages Vcp and Vcn are used to control the operation of the oscillator section 13. The control voltage Vcp and the control voltage Vcn are set in a symmetrical relation to each other with the respect to the intermediate potential $V_{DD}/2$ between the power supply $V_{DD}$ and the ground terminal GND set as a reference. The oscillator section 13 is constructed by connecting an odd number of n-stage delay circuits 11-1 to 11-n in a ring form, and an output of the final stage delay circuit 11-n is output as an oscillation output OSC via an inverter 18.

As shown in FIG. 11, each of the delay circuits 11-1 to 11-n constituting the oscillator section 13 includes P-channel MOS transistors P11 to P14 and N-channel MOS transistors N11 to N14. The current paths of the MOS transistors P11, P12, N12, and N11 are serially connected between the power supply $V_{DD}$ and the ground terminal GND and the gates thereof are supplied with an input signal $V_{IN}$. The source and drain of the MOS transistor P11 are respectively connected to the source and drain of the MOS transistor P13 and the gate of the MOS transistor P13 is supplied with the control signal Vcp output from the inverter 14. The drain and source of the MOS transistor N11 are respectively connected to the drain and source of the MOS transistor N13 and the gate of the MOS transistor N13 is supplied with the control signal Vcn. The source-drain path of the MOS transistor P14 is connected between the power supply $V_{DD}$ and a connection node of the MOS transistors N12 and N11, the drain of the MOS transistor P14 is connected to a connection node of the MOS transistors P11 and P12, and the source thereof is connected to the ground terminal GND. The gates of the MOS transistors P14 and N14 are supplied with the input signal $V_{IN}$. An output signal $V_{OUT}$ is output from a connection node of the drains of the MOS transistors P12 and N12.

When the circuit of the above construction is formed in an IC form, a parasitic capacitor expressed by a capacitor Cp in an equivalent form is formed between a connection node (node V12) between the MOS transistors P11 and P12 and the power supply $V_{DD}$. A parasitic capacitor expressed by a capacitor Cn in an equivalent form is formed between a connection node (node V12) of the MOS transistors N11, N12, and N13 and the ground terminal GND. Further, a parasitic capacitor Co is formed between the output terminal and the ground terminal GND.

The circuit is constructed to output a signal $V_{OUT}$ which is equal to the inverted form of the input signal $V_{IN}$, the minimum oscillation frequency $f_{min}$ is determined by the MOS transistors P11 and N11, and the oscillation frequency (from the minimum oscillation frequency $f_{min}$ to the maximum oscillation frequency $f_{max}$) corresponding to the levels of the control signals Vcp and Vcn can be set by means of the MOS transistors P13 and N13. The MOS transistor N14 discharges the node V11 to the "L" level when the level of the input signal $V_{IN}$ is set close to the threshold voltage of the P-channel MOS transistor to turn OFF the MOS transistor P12. On the other hand, the MOS transistor P14 charges the node V12 to the "H" level when the level of the input signal $V_{IN}$ is set close to the threshold voltage of the N-channel MOS transistor to turn OFF the MOS transistor N12. When the MOS transistor P12 or N12 is set in the ON state, the potentials of the source and drain of the MOS transistor P12 or N12 are set substantially equal to each other. Therefore, even if the parasitic capacitors Cp and Cn are present, the capacitors will not be charged and there occurs no charge sharing. As a result, the delay time will not be reduced and the minimum oscillation frequency $f_{min}$ can be set to a designed value determined by the MOS transistors P11 and N11. Further, since the potentials of the nodes V11 and V12 can be stably set at the "L" and "H" levels, respectively, it becomes possible to fully swing the output signal $V_{OUT}$ from the ground potential to the power supply potential. As a result, the influence by variations in the control voltages Vcp and Vcn and variations in the threshold voltages of the MOS transistors caused in the manufacturing process can be suppressed and degradation of the duty of the oscillation waveform and abnormal oscillation caused by the degradation of the duty can be prevented without fail.

When the levels of the control voltages Vcp and Vcn rise and currents flowing in the MOS transistors P13 and N13 are increased, it becomes impossible for the MOS transistors N14 and P14 to respectively set the potentials of the nodes V12 and V11 to the "L" and "H" levels, and the potentials of the nodes V12 and V11 are set to the intermediate level, thereby causing the charge sharing. However, in this case, since the current driving abilities of the MOS transistors P13 and N13 become sufficiently large and the output amplitude thereof becomes large, the rate of the voltage variation caused by the charge sharing to the output amplitude is small, thereby giving substantially no influence on the operation of the VCO.

FIG. 12 shows a VCO according to a seventh embodiment of this invention.

Like the former embodiments, the VCO includes a control section 12 and an oscillator section 13. The control section 12 includes a NAND gate 19, resistors R9 and R10, inverter 20, transfer gate 21, and N-channel MOS transistor N30. One end of the resistor R9 and one end of the current path of the transfer gate 21 are applied with a control voltage Vcn. The input terminal of the inverter 20, the gate of a P-channel MOS transistor in the transfer gate 21 and the gate of the MOS transistor N30 are supplied with a power down signal PD. The other end of the resistor R9 is connected to one input terminal of the NAND gate 19 and one end of the resistor R10, and the output terminal of the inverter 20 is connected to the other input terminal of the NAND gate 19 and the gate of an N-channel MOS transistor in the transfer gate 21. The output terminal of the NAND gate 21 is connected to the other end of the resistor R10 and a control signal line 22-1. The other input terminal of the transfer gate 21 is connected to a control signal line 22-2. The MOS transistor N30 is connected between the signal line 22-2 and the ground terminal GND.

The first stage 11-1 of the delay circuits constructing the oscillator section 13 includes P-channel MOS transistors P31 to P34 and N-channel MOS transistors N30 to N35. The current paths of the MOS transistors P31, P32, N32 and N31 are serially connected between the power supply $V_{DD}$ and the ground terminal GND. The gate of the MOS transistor P31 is connected to the control signal line 22-1 and the gates of the MOS transistors P32, N32 and N31 are connected to the output terminal of the final stage delay circuit 11-n. The source and drain of the MOS transistor P31 are respectively connected to the source and drain of the MOS transistor P33 and the drain-source path of the MOS transistor N35 is connected between a connection node of the MOS transistors P32 and N32 and the ground terminal GND. The gates of the MOS transistors P33 and N35 are supplied with the power down signal PD. The source-drain path of the MOS transistor P34 is connected between the power supply $V_{DD}$ and a connection node of the MOS transistors N32 and N31 and the gate of the MOS transistor P34 is supplied with an output signal of the final stage delay circuit 11-n. Further, the drain-source path of the MOS transistor N34 is connected between a connection node of the MOS transistors P31 and P32 and the ground terminal GND and the gate of the MOS transistor N34 is supplied with the output signal of the final stage delay circuit 11-n. The drain and source of the MOS transistor N31 are respectively connected to the drain and source of the MOS transistor N33 and the gate of the MOS transistor N33 is connected to the control signal line 22-2.

The second and succeeding stages of the delay circuits 11-2 to 11-n have the same circuit construction as that shown in FIG. 11. The delay circuits 11-1 to 11-n of an odd number are connected in a ring form and an oscillation output OSC is derived from the final stage delay circuit 11-n via the inverter 18.

With the above construction, the voltage controlled oscillator circuit shown in FIGS. 10 and 11 can be controlled according to the level of the power down signal PD. That is, when the power down mode is selected and the power down signal PD is set to the "H" level, the transfer gate 21 is set into the OFF state, the MOS transistor N30 is turned ON, and the output of the NAND gate 19 is set to the "H" level. As a result, The potentials of the control signal lines 22-1 and 22-2 are respectively set to the "H" level and "L" level so as to turn OFF the MOS transistors P31 and N33 in the delay circuit 11-1 and the MOS transistors P13 and N13 in the delay circuits 11-2 to 11-n. Further, setting of the power down signal PD at the "H" level causes the MOS transistor P33 in the delay circuit 11-1 to be turned OFF and the MOS transistor N35 to be turned ON. Therefore, the operation of the first stage delay circuit 11-1 is interrupted and the output signal is fixed at the "L" level. Outputs of the delay circuits 11-2, 11-4, --- of the second and succeeding even-numbered stages are fixed at the "H" level and outputs of the delay circuits 11-3, ---, 11-n of odd-numbered stages are fixed at the "L" level, and the oscillating operation is interrupted. Since no current flows in the delay circuits 11-1 to 11-n in the state in which the outputs are fixed at the "H" and "L" levels, substantially no current is consumed.

On the other hand, when the power down signal PD is at the "L" level, the transfer gate 21 is set in the ON state, the MOS transistor N30 is set in the OFF state, and the output of the NAND gate 19 is set to an intermediate level between the "H" level and the "L" level. As a result, the potentials of the control signal lines 22-1, 22-2 are set to the control voltages Vcp, Vcn so as to turn ON the MOS transistors P31 and N33 in the delay circuit 11-1 and the MOS transistors P13 and N13 in the delay circuits 11-2 to 11-n. Further, setting of the power down signal PD at the "L" level causes the MOS transistors P33 and N35 in the delay circuit 11-1 to be respectively turned ON and OFF. Therefore, the first stage delay circuit 11-1 is made to have substantially the same circuit construction as that of the second and succeeding stage delay circuits 11-2 to 11-n and the oscillating operation is effected. The operation effected at this time is the same as that of the circuit shown in FIG. 1 and the same effect as that of the sixth embodiment can be attained.

FIGS. 13 to 16 show examples of the construction of the delay circuit, for illustrating a voltage controlled oscillator according to eighth to eleventh embodiments of this invention. The delay circuits of an odd number of stages are connected in a ring form to constitute an oscillation circuit. In each of the circuits, the oscillation frequency is controlled by an N-channel MOS transistor whose gate is applied with a control signal Vcn.

Figure 13:
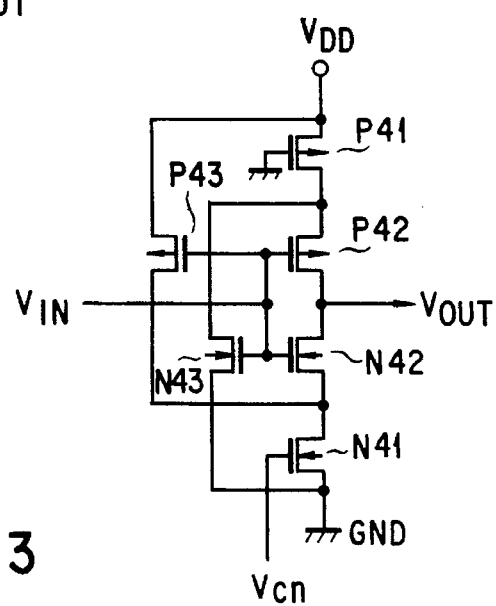
FIG. 13 is a circuit diagram showing an example of the construction of the delay circuit, for illustrating a voltage controlled oscillator according to an eighth embodiment of this invention.

The circuit shown in FIG. 13 includes P-channel MOS transistors P41 to P43 and N-channel MOS transistors N41 to N43. The current paths of the MOS transistors P41, P42, N42 and N41 are serially connected between a power supply $V_{DD}$ and a ground terminal GND. The gate of the MOS transistor P41 is connected to the ground terminal GND and the gate of the MOS transistor N41 is applied with a control voltage Vcn. The gates of the MOS transistors P42 and N42 are supplied with an input signal $V_{IN}$ and an output signal $V_{OUT}$ is derived from a connection node of the MOS transistors P42 and N42. The source of the MOS transistor P43 is connected to the power supply $V_{DD}$, the drain thereof is connected to a connection node of the transistors N42 and N41, and the gate thereof is supplied with the input signal $V_{IN}$. Further, the drain of the MOS transistor N43 is connected to a connection node of the transistors P41 and P42, the source thereof is connected to the ground terminal GND, and the gate thereof is supplied with the input signal $V_{IN}$.

If n-stage delay circuits each having the same circuit construction as the delay circuit of FIG. 13 are connected in a ring form to construct an oscillator, the oscillation is interrupted at the time of occurrence of the minimum oscillation frequency $f_{min}$. However, the potential of a connection node of the transistors P41 and P42 and the potential of a connection node of the transistors N42 and N41 can be stabilized by means of the transistors P43 and N43.

The circuit shown in FIG. 14 includes P-channel MOS transistors P51 to P53 and N-channel MOS transistors N51 to N54. The current paths of the MOS transistors P51, P52, N52 and N51 are serially connected between a power supply $V_{DD}$ and a ground terminal GND and the gates thereof are supplied with an input signal $V_{IN}$. The source of the MOS transistor P53 is connected to the power supply $V_{DD}$, the drain thereof is connected to a connection node of the transistors N52 and N51, and the gate thereof is supplied with the input signal $V_{IN}$. Further, the drain of the MOS transistor N53 is connected to a connection node of the transistors P51 and P52, the source thereof is connected to the ground terminal GND, and the gate thereof is supplied with the input signal $V_{IN}$. The current path of the MOS transistor N54 is connected in parallel with the current path of the MOS transistor N51 and the gate thereof is applied with a control voltage Vcn. An output signal $V_{OUT}$ obtained by delaying the input signal $V_{IN}$ is derived from a connection node of the transistors P52 and N52.

The circuit shown in FIG. 14 is equivalent to the circuit obtained by omitting the P-channel MOS transistor P13 in the circuit of FIG. 11.

The delay circuit shown in FIG. 15 includes P-channel MOS transistors P61 and P62 and N-channel MOS transistors N61 and N62. The current paths of the MOS transistors P61, N61, and N62 are serially connected between a power supply $V_{DD}$ and a ground terminal GND. The gates of the transistors P61 and N61 are supplied with an input signal $V_{IN}$ and the gate of the transistor N62 is applied with a control voltage Vcn. Further, the source of the MOS transistor P62 is connected to the power supply $V_{DD}$, the drain thereof is connected to a connection node of the transistors N61 and N62, and the gate thereof is supplied with the input signal $V_{IN}$. An output signal $V_{OUT}$ obtained by delaying the input signal $V_{IN}$ is derived from a connection node of the transistors P61 and N61.

Like the circuit of FIG. 13, in the circuit shown in FIG. 15, the oscillation is interrupted at the time of occurrence of the minimum oscillation frequency $f_{min}$.

The delay circuit shown in FIG. 16 additionally includes an N-channel MOS transistor N63 having a gate supplied with an input signal $V_{IN}$ and connected between a connection node of the transistors P61 and P62 and the ground terminal GND in the circuit of FIG. 15.

In the circuits shown in FIGS. 13 to 16, it is of course possible to achieve the same characteristic by inverting the conductivity types of the N-channel MOS transistors and P-channel MOS transistors, inverting the polarities of the power supply, supplying Vcp as the control signal, and using the P-channel MOS transistor to control the oscillation frequency.

As described above, the following effects can be attained by the VCO of this invention. The variable range of the oscillation frequency can be enlarged, and a stable oscillation frequency can be obtained in a range from the low frequency to the high frequency. Further, it can be applied to various types of application systems. Even when the control voltage is set to the ground potential, the oscillation is not interrupted and it can be easily applied to the application system. Further, the influence by the charge sharing caused by the parasitic capacitor can be prevented. The influence by a variation in the control voltage and a variation in the threshold voltage of each MOS transistor caused in the manufacturing process can be suppressed and degradation of the duty of the oscillation waveform and occurrence of abnormal oscillation caused by the degradation of the duty can be prevented.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A voltage controlled oscillator comprising:
   an odd number of stages of delay circuits connected in a ring form, each for delaying a signal input thereto and outputting the signal;
   each of said delay circuits including:
      a first transistor of first conductivity type whose current path is connected at one end to a first potential supplying source and whose conduction state is controlled by an input signal;
      a second transistor of the first conductivity type whose current path is connected at one end to the other end of the current path of said first transistor and whose conduction state is controlled by the input signal;
      a third transistor of second conductivity type whose current path is connected at one end to the other end of the current path of said second transistor and whose conduction state is controlled by the input signal;
      a fourth transistor of the second conductivity type which is connected between the other end of the current path of said third transistor and a second potential supplying source and whose conduction state is controlled by the input signal;
      a fifth transistor of the first conductivity type which is connected between said first potential supplying source and a connection node of said first and second transistors and whose conduction state is controlled by a first control voltage;
      a sixth transistor of the second conductivity type which is connected between a connection node of said third and fourth transistors and said second potential supplying source and whose conduction state is controlled by a second control voltage which is symmetrical to the first control voltage with respect to an intermediate potential between the potentials of said second and first potential supplying source;
      a seventh transistor of the first conductivity type which is connected between said first potential supplying source and the connection node of said third and fourth transistors and whose conduction state is controlled by the input signal; and
      an eighth transistor of the second conductivity type which is connected between the connection node of said first and second transistors and said second potential supplying source and whose conduction state is controlled by the input signal;
   wherein a delayed input signal is output from a connection node of said second and third transistors.

2. A voltage controlled oscillator according to claim 1, further comprising inverting amplifier means supplied with the first control voltage for generating a second control voltage which is set in a symmetrical relation to the first control voltage with respect to an intermediate potential between the potential of said first potential supplying source and the potential of said second potential supplying source set as a reference; an oscillation frequency of the oscillator being controlled by changing the first control voltage.

3. A voltage controlled oscillator according to claim 2, wherein said inverting amplifier means includes a first resistor having one end applied with the first control voltage; an inverter having an input terminal connected to the other end of said first resistor and generating an output for controlling the conduction state of said sixth transistor of each of said delay circuits; and a second resistor connected at one end to the input terminal of said inverter and connected at the other end to an output terminal of said inverter.

4. A voltage controlled oscillator according to claim 1, wherein one of said odd number of stages of delay circuits connected in a ring form includes a ninth transistor of the first conductivity type whose current path is connected at one end to said first potential supplying source and whose conduction state is controlled by the input signal; a tenth transistor of the first conductivity type whose current path is connected at one end to the other end of the current path of said ninth transistor and whose conduction state is controlled by the input signal; an eleventh transistor of the second conductivity type whose current path is connected at one end to the other end of the current path of said tenth transistor and Whose conduction state is controlled by the input signal; a twelfth transistor of the second conductivity type which is connected between the other end of the current path of said eleventh transistor and said second potential supplying source and whose conduction state is controlled by the second control voltage; a thirteenth transistor of the first conductivity type whose current path is connected at one end to said first potential supplying source and connected at the other end to a connection node of said eleventh and twelfth transistors and whose conduction state is controlled by the input signal; a fourteenth transistor of the second conductivity type whose current path is connected at one end to a connection node of said ninth and tenth transistors and connected at the other end to said second potential supplying source and whose conduction state is controlled by the input signal; a fifteenth transistor of the first conductivity type whose current path is connected in parallel with said ninth transistor and whose conduction state is controlled by the first control voltage; a sixteenth transistor of the second conductivity type whose current path is connected at one end to a connection node of said tenth and eleventh transistors and connected at the other end to said first potential supplying source and whose conduction state is controlled by an oscillation control signal for controlling the oscillating operation; and a seventeenth transistor whose current path is connected in parallel with said twelfth transistor and whose conduction state is controlled by the oscillation control signal; a delay signal of the input signal being output from the connection node of said tenth and eleventh transistors.

5. A voltage controlled oscillator according to claim 4, further comprising control means supplied with the first control voltage for generating a second control voltage which is set in a symmetrical relation to the first control voltage with respect to an intermediate potential between said second potential supplying source and said first potential supplying source set as a reference when an oscillation control signal is set at a significant level; the oscillation frequency being controlled by changing the first control voltage.

6. A voltage controlled oscillator according to claim 5, wherein said control means includes a first resistor having one end applied with the first control voltage; a NAND gate having a first input terminal connected to the other end of said first resistor, a second input terminal supplied with an inverted signal of the oscillation control signal, and an output terminal for outputting the second control voltage; a second resistor connected between the first input terminal and the output terminal of said NAND gate; and means for applying the second control voltage to each of said delay circuits when the oscillation control signal is set at the significant level and supplying the potential of said first potential supplying source as the second control voltage at the other time.

7. A voltage controlled oscillator comprising:
an odd number of stages of delay circuits connected in a ring form, each for delaying a signal input thereto and outputting the signal;
each of said delay circuits including:
a first transistor of first conductivity type having a current path connected at one end to a first potential supplying source and a conduction state controlled by a control voltage;
a second transistor of the first conductivity type having a current path connected at one end to the other end of the current path of said first transistor and having a conduction state controlled by an input signal;
a third transistor of second conductivity type which is connected between the other end of the current path of said second transistor and a second potential supplying source and having a conduction state controlled by the input signal;
a fourth transistor of the second conductivity type having a current path connected at one end to said second potential supplying source and connected at the other end to a connection node of said first and second transistors and conduction state controlled by the input signal; and
a fifth transistor of the first conductivity type having a current path connected in parallel with the current path of said first transistor and a conduction state controlled by an input signal;
wherein a delayed signal of the input signal is output from a connection node of said second and third transistors.

8. A voltage controlled oscillator according to claim 7, further comprising a sixth transistor of the second conductivity type whose current path is connected between said third transistor and said second potential supplying source and whose conduction state is controlled by the input signal; and a seventh transistor of the second conductivity type whose current path is connected at one end to a connection node of said sixth and third transistors and connected at the other end to said first potential supplying source and whose conduction state is controlled by the input signal.

9. A voltage controlled oscillator comprising:
an odd number of stages of delay circuits connected in a ring form, each for delaying a signal input thereto and outputting the signal;
each of said delay circuits including:
a first transistor of first conductivity type having a current path connected at one end to a first potential supplying source and a conduction state controlled by a control voltage;
a second transistor of the first conductivity type having a current path connected at one end to the other end of the current path of said first transistor and a conduction state controlled by an input signal;

a third transistor of second conductivity type connected between the other end of the current path of said second transistor and a second potential supplying source and having a conduction state controlled by the input signal;

a fourth transistor of the second conductivity type having a current path connected at one end to said second potential supplying source and connected at the other end to a connection node of said first and second transistors and conduction state controlled by the input signal;

a fifth transistor of the second conductivity type having a current path connected between said second potential supplying source and said third transistor, said fifth transistor being set in conductive state by the potential of said first potential supplying source; and a sixth transistor of the first conductivity type having a current path connected at one end to a connection node of said fifth and third transistors and connected at the other end to said first potential supplying source and having a conduction state controlled by the input signal;

wherein a delayed signal of the input signal is output from a connection node of said second and third transistors.

* * * * *

UNITED STATES PATENT AND TRADEMARK OFFICE
CERTIFICATE OF CORRECTION

PATENT NO. : 5,594,391
DATED : January 14, 1997
INVENTOR(S) : Akihiko YOSHIZAWA et al.

It is certified that error appears in the above-indentified patent and that said Letters Patent is hereby corrected as shown below:

laim 4, column 15, line 29, "Whose" should read --whose--.

Signed and Sealed this

Tenth Day of June, 1997

BRUCE LEHMAN

Attest:

Attesting Officer

Commissioner of Patents and Trademarks